United States Patent [19]

Elbert

[11] Patent Number: 4,687,962

[45] Date of Patent: Aug. 18, 1987

[54] ULTRASONIC HORN DRIVING APPARATUS AND METHOD WITH ACTIVE FREQUENCY TRACKING

[75] Inventor: Lawrence E. Elbert, Huntington Beach, Calif.

[73] Assignee: Baxter Travenol Laboratories, Inc., Deerfield, Ill.

[21] Appl. No.: 941,977

[22] Filed: Dec. 15, 1986

[51] Int. Cl.⁴ ........................ H01L 41/08; B01F 11/00

[52] U.S. Cl. .................................... 310/316; 310/317; 360/117

[58] Field of Search ............... 310/314, 316, 317, 318; 239/102.2; 366/108, 116, 117, 118, 120, 127, 342, 600; 318/116, 118

[56] References Cited

U.S. PATENT DOCUMENTS

| | | | |
|---|---|---|---|
| 3,819,961 | 6/1974 | Bourgeois et al. | 310/316 |
| 3,889,166 | 6/1975 | Scurlock | 310/316 X |
| 4,562,413 | 12/1985 | Mishiro et al. | 310/316 X |
| 4,626,728 | 12/1986 | Flachenecker et al. | 310/316 |

FOREIGN PATENT DOCUMENTS

| | | | |
|---|---|---|---|
| 0651855 | 9/1979 | U.S.S.R. | 310/316 |
| 0698674 | 11/1979 | U.S.S.R. | 310/316 |

*Primary Examiner*—Mark O. Budd

*Attorney, Agent, or Firm*—Perman & Green

[57] ABSTRACT

The actual resonant frequency of an ultrasonic horn is tracked actively while the horn is operating in a working environment, such as in a clinical analyzer where the horn is partly immersed in a liquid bath in which a series of liquid-filled cuvettes are passed near the horn to dissolve solid tablets in the cuvettes. The horn is driven initially by a signal of fixed amplitude but at a frequency which is varied between set limits about a nominal resonant frequency. Ultrasonic vibration waves of the horn are sensed and fed back for rectification and peak detection over the scan operation. The peak feed back level is held and a second scan is initiated with the drive signal at the same fixed amplitude. When the rectified feedback signal level substantially attains that of the held peak level, a comparison is determined and control logic acts to lock on the frequency at which the comparison was established for a given operating time period.

9 Claims, 5 Drawing Figures

ULTRASONIC HORN DRIVING APPARATUS AND METHOD WITH ACTIVE FREQUENCY TRACKING

BACKGROUND OF THE INVENTION

1. Field of the Invention

The present invention relates generally to apparatus for and a method of driving an ultrasonic horn, and particularly to a scheme in which the resonant frequency of the horn in an operating environment is determined periodically, and the frequency of a horn drive signal is adjusted to correspond to the determined resonant frequency of the horn.

2. Description of the Known Art

Ultrasonic horns are employed in clinical analyzers of the kind in which a series cuvettes pass on belt means through a temperature controlled liquid bath, so as to bring liquid solutions contained in the cuvettes up to the bath temperature. The horn serves to dissolve solid reagent tablets in the liquid solutions in the cuvettes while the belt means conveys the cuvettes within the operating region of the horn. Further details of an ultrasonic horn suitable for use in a clinical analyzer liquid bath can be found in U.S. patent application Ser. No. 697,277, filed Feb. 1, 1985, and assigned to the assignee of the present invention.

In the known systems, the horn is driven by a signal of fixed frequency corresponding to an assumed resonant frequency for the horn. It will be appreciated that maximum efficiency is obtained, i.e., ultrasonic waves produced by the horn are of greatest amplitude for a certain fixed amplitude of the drive signal, when the drive signal frequency is matched to the resonant frequency of the horn in an actual operating environment. It will also be understood that if a resonant frequency for the horn is determined at the time of manufacture, and drive circuitry for the horn is adjusted to match the determined resonant frequency, the operating environment in which the horn is placed, i.e., air or liquid, varying temperatures, and different densities of liquid solutions in cuvettes moving in the operating region of the horn, all will act to change the initially assumed resonant frequency.

As far as is known, there has not been proposed any process or system for operating an ultrasonic horn in a changing environment while actively tracking the resonant frequency of the horn and effecting a corresponding adjustment in the frequency of the drive signal for the horn.

SUMMARY OF THE INVENTION

An object of the present invention is to provide apparatus for and a method of actively tracking the resonant frequency of an ultrasonic horn in an operating environment, and adjusting the frequency of a horn drive signal to match the resonant frequency as tracked.

Another object of the invention is to provide apparatus and a process for controlling the amplitude of the horn drive signal to maintain a constant amplitude level of ultrasonic waves produced by the horn after the frequency of the drive signal is matched to a most recently determined resonant frequency for the horn.

A further object of the invention is to reduce the requirement of high precision in measurement of resonant frequency of ultrasonic horns at the time of manufacture, by allowing the resonant frequency to be determined periodically for the horn in an operating environment, and the frequency of the horn drive signal to be matched continuously to a most recently determined or updated value for the resonant frequency of the horn.

Another object of the invention is to provide apparatus and a process for operating an ultrasonic horn in which imminent failure of the horn can be detected in advance as the horn deteriorates over time in use.

According to the invention, apparatus for driving an ultrasonic horn under varying load conditions, includes frequency scanning and drive means for driving the horn with a drive signal of determined amplitude and frequency, feedback means in the region of the horn for sensing ultrasonic vibration waves of the horn when driven by the scanning and drive means, and for producing a signal corresponding to the frequency and amplitude of the ultrasonic waves, rectifier means for detecting the output of the feedback means and developing an amplitude signal corresponding to the amplitude of said output, detector means for developing a peak signal representing the maximum level of the amplitude signal obtained during a first scan cycle of the scanning and drive means in which the drive signal is of fixed amplitude but varied in frequency between limits about a nominal resonant frequency, comparator means for comparing the amplitude signal and the peak signal with one another over a second scan cycle of the scanning and drive means between said frequency limits with said fixed amplitude drive signal and for producing a match signal indicative of a resonant condition for the horn when the amplitude and the peak signals substantially coincide, and control means for controlling the first and the second scan cycles and interrupting the second scan cycle in response to the match signal, and for enabling the scanning and drive means to continue to operate the horn over a given time period at a frequency corresponding to the resonant condition.

According to another aspect of the invention, a method of tracking the operating resonant frequency of an ultrasonic horn having a nominal resonant frequency, includes driving the horn with a signal of fixed amplitude while varying the frequency of the drive signal over a first scan cycle between limits about the nominal resonant frequency, sensing ultrasonic vibration waves from the horn over the first scan cycle, producing a feedback signal corresponding in frequency and amplitude to the ultrasonic waves, developing an amplitude signal representing the amplitude of the feedback signal over the scan cycle, detecting and holding the peak of the amplitude signal thereby forming a peak signal corresponding to the maximum level of the amplitude signal attained over the first scan cycle, driving the horn with the fixed amplitude drive signal while varying the frequency of the drive signal over a second scan cycle between said limits, comparing the amplitude signal and the peak signal with one another during the second scan cycle and producing a match signal representing a resonant condition of the horn when the amplitude and the peak signals substantially coincide, and continuing to drive the horn at a frequency corresponding to the resonant condition for a given time period.

The various features of novelty which characterize the invention are pointed out with particularity in the claims annexed to and forming a part of the present disclosure. For a better understanding of the invention, its operating advantages and specific objects attained by its use, reference should be had to the accompanying drawing and descriptive matter in which there is illustrated and described a preferred embodiment of the invention.

DETAILED DESCRIPTION OF THE INVENTION

Figure 1:
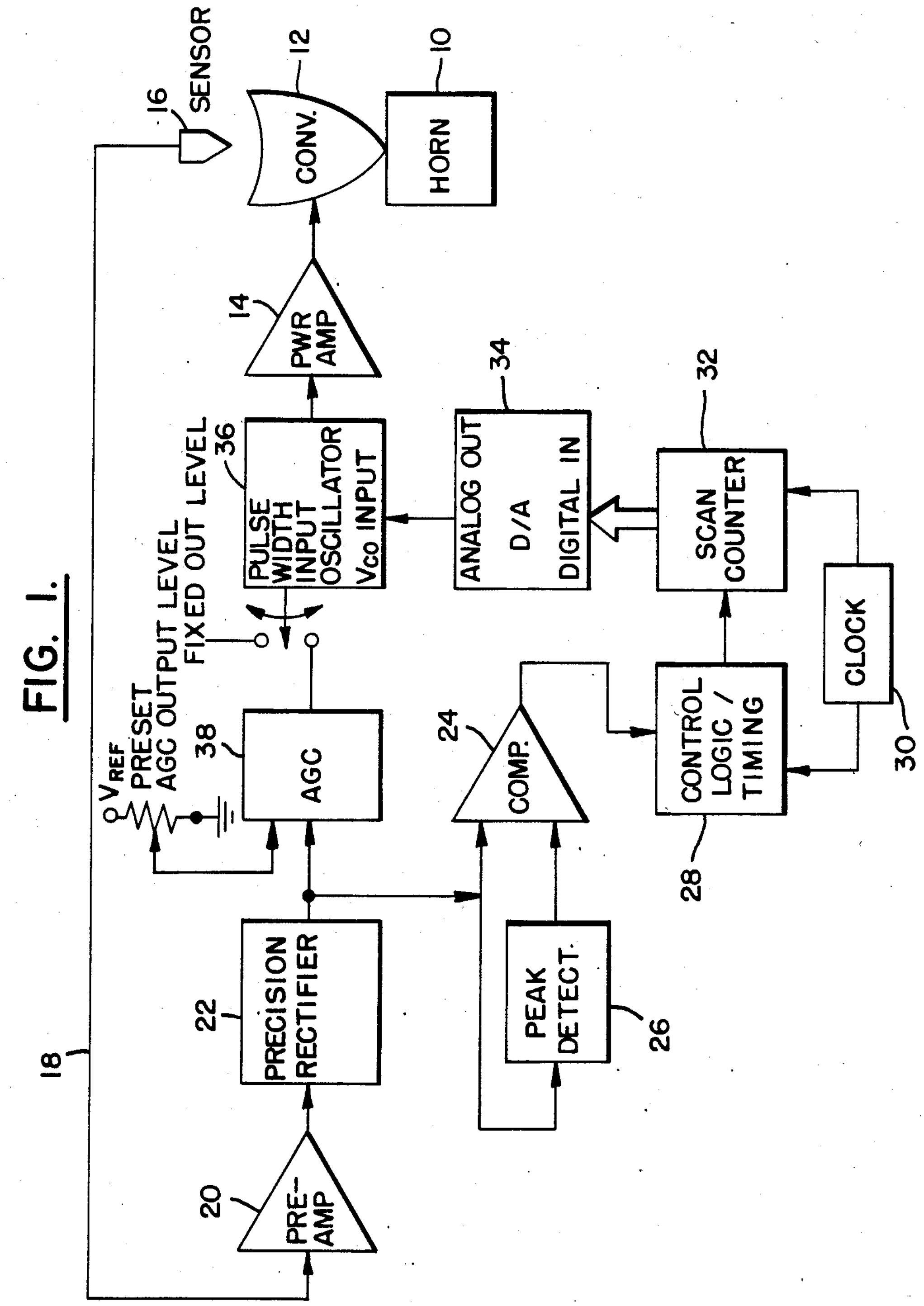
FIG. 1 is a schematic diagram of a system for actively tracking the resonant frequency of an ultrasonic horn in an operating environment, according to the invention.

FIG. 1 shows, in block form, components of a system for actively tracking the resonant frequency of an ultrasonic horn, so as to adjust the frequency of a drive signal for the horn to the resonant frequency, in accordance with the present invention.

An ultrasonic horn 10 which may have a nominal resonant frequency of, for example, 30 kilohertz (KHZ) is driven by an ultrasonic converter 12 associated with the horn 10. The horn 10 and the converter 12 may be in the form of a single assembly such as disclosed in the mentioned U.S. patent application Ser. No. 697,277, filed on Feb. 1, 1985 entitled "Ultrasonic Horn Assembly" in the names of Lawrence E. Elbert and Charles S. Irwin, the relevant portions of which are incorporated by reference herein. Converter 12 basically includes piezo electric elements which convert electrical energy in the form of a drive signal from a power amplifier 14 to mechanical vibrations at a frequency corresponding to that of the drive signal. Vibrations are imparted to the horn 10 through connecting means which joins the converter 12 to the horn 10.

The horn and converter assembly may be at least partially immersed in a liquid bath within a clinical analyzer (not shown), to interact with liquid solutions contained in a series of cuvettes (not shown) which are moved past horn 10 by appropriate belt means in the analyzer. As a result, solid reagent tablets in the cuvettes are caused to dissolve in the liquid solutions, whereafter the solutions are analyzed by a spectrophotometer. It will thus be appreciated that thorough dissolution of the solid tablets by the acoustic mixing action of the horn 10 is essential in order that reliable analytical data be obtained. Should the resonant frequency of the horn 10 change appreciably from the frequency of the converter drive signal, the acoustic wave energy produced by the horn 10 may diminish below that required for thorough dissolution.

An acoustic transducer or sensor element 16 is positioned in the region of the horn 10 to sense ultrasonic vibration or acoustic waves produced by the horn in the operating environment. Sensor element 16 provides a feedback signal which is transmitted over a cable 18 to the input of a preamplifier 20. Since the feedback signal should be within known frequency limits about the resonant frequency of the horn 10, suitable filtering may be incorporated in the preamplifier 20 to suppress noise or other spurious signals appearing at the input of the preamplifier.

The feedback signal as amplified (and filtered) by the preamplifier 20 is rectified by precision rectifier circuitry 22 and supplied to one input of a comparator 24. The peak amplitude of the rectified feedback signal is established and held by peak detect circuitry 26 the output of which is supplied to the remaining input of comparator 24. When the signals supplied to the inputs of the comparator 24 are matched, the comparator supplies an output signal to control logic and timing circuitry 28. A system clock 30 which may operate at a frequency of, e.g. 790 Hz, supplies clock signals to the control logic and timing circuitry 28 and a scan counter 32 which produces a binary up count output. The output of scan counter 32 is converted to a corresponding analog signal by a digital to analog (D/A) converter 34, and the analog output of the converter 34 is applied to a voltage controlled oscillator (VCO) 36. Produced within the VCO are a series of pulses whose frequency is determined by the DC level of the signal from the D/A converter 34 (ratio of on time to off time) and whose duty cycle can be selectively fixed or determined by the output of an automatic gain control (AGC) circuit 38. The pulses are converted in the VCO 36 to output an approximate sine wave whose amplitude is determined by the pulse duty cycle.

The amplified and rectified feedback signal from the sensor element 16 is supplied to one input of the AGC circuit 38 from the output of rectifier circuitry 22, and a reference signal the level of which can be preset as desired is supplied to the remaining input of AGC circuit 38. Thus, when switched to an input of the VCO 36, the AGC circuit 38 varies the AC signal amplitude of VCO output signal so that the average output power is maintained and the level of the rectified feedback signal coincides with the desired preset level.

The system of FIG. 1 operates basically as follows.

The preamplifier 20 amplifies the feedback signal from the horn 10 as picked up by the sensor element 16 and transmitted over the cable 18. The rectifier circuitry 22 converts the ultrasonic frequency feedback signal (e.g. 30 KHZ) to a varying DC level in proportion to the peak-to-peak amplitude of the feedback signal. The resonant frequency peak of the horn 10 is determined by the comparator 24 and peak detect circuitry 26, by initiating a first and then a second scan cycle of the VCO 36 while maintaining a fixed AC amplitude output from the VCO 36, and varying the frequency of the output signal between limits about a known nominal resonant frequency for the horn 10. The first scan cycle is initiated by the control logic/timing 28 at a particular time at which the scan counter 32 drives the D/A converter 34 so that the VCO 36 sweeps from, e.g., a lower frequency limit of 25.5 KHZ to an upper frequency limit of 35.5 KHZ. The VCO sweep frequency output is amplified by the power amplifier 14 and the horn 10 is caused to produce acoustic waves of correspondingly varied frequency by the converter 12. Of course, the VCO 36 can be swept from an upper to a lower frequency limit, i.e., a decreasing frequency sweep, if desired.

Through the duration of the first scan cycle, the amplitude of acoustic waves produced by the horn 10 will be at a maximum level when the frequency of the horn drive signal is at the actual resonant frequency of the horn. Accordingly, the sensor element 16 will produce a feedback signal the level of which will peak when the horn drive signal is at the resonant frequency. Such peak level is held by the peak detect circuitry 26 and maintained at the corresponding input to comparator 24. Following the first scan cycle, the control logic/-timing 28 initiates a second scan cycle by the scan counter 32 with the power of the VCO output remaining fixed, and the previously detected peak level is held at the one input to the comparator 24. When, during the second scan cycle, the frequency of the VCO output corresponds to that at which a peak in the feedback signal was obtained in the first scan cycle, the same peak will be provided to the remaining input terminal of comparator 24 by the rectifier circuitry 22, and a match signal is provided from the comparator to the control logic/timing 28. Responsive to the match signal, the control logic/timing inhibits further counting of the scan counter 32 so that a fixed voltage level is provided from the D/A converter 34 to control the VCO 36. That is, the frequency of the output signal from the VCO corresponds to the frequency at which a resonant condition of the horn 10 has been determined.

Next, the level of the VCO output signal is allowed to be controlled by the AGC circuit 38 so that a drive signal of fixed frequency and gain-controlled amplitude is provided from the power amplifier 14 to the horn converter 12. The time over which the first and second scan cycles occur is relatively short, each scan cycle being allotted a scan time of, for example, about 325 milliseconds. The operating time over which the horn 10 is driven by a gain-controlled signal at a determined or updated resonant frequency is substantially longer, for example, 15 seconds. The time allotted for the scan cycles is limited by the response of the horn 10 under such scan condition, that is, the scan must be slow enough to allow the horn to respond to the change of frequency. The time over which the horn is operated in a gain-controlled mode at each updated resonant frequency should take into account changes in horn loading conditions which would affect its resonant operating frequency. In a clinical analyzer, the presence or absence of cuvettes is one example of changing load conditions. In such an environment, a time duration of about 15 seconds of operation at the updated resonant frequency should suffice.

Figure 2A:
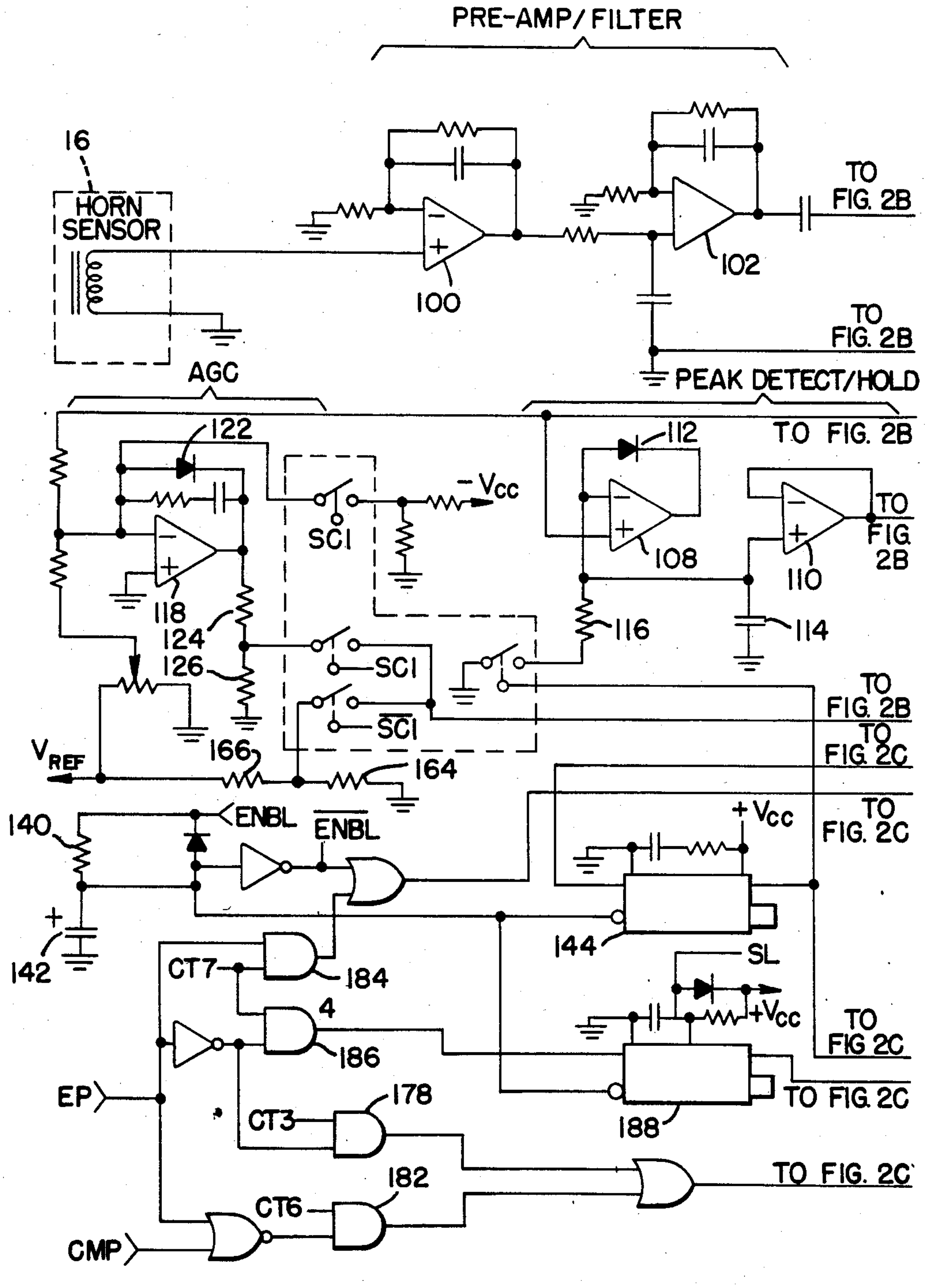
FIGS. 2A, 2B, and 2C together form an electrical schematic diagram showing details of the system of FIG. 1.
Figure 2B:
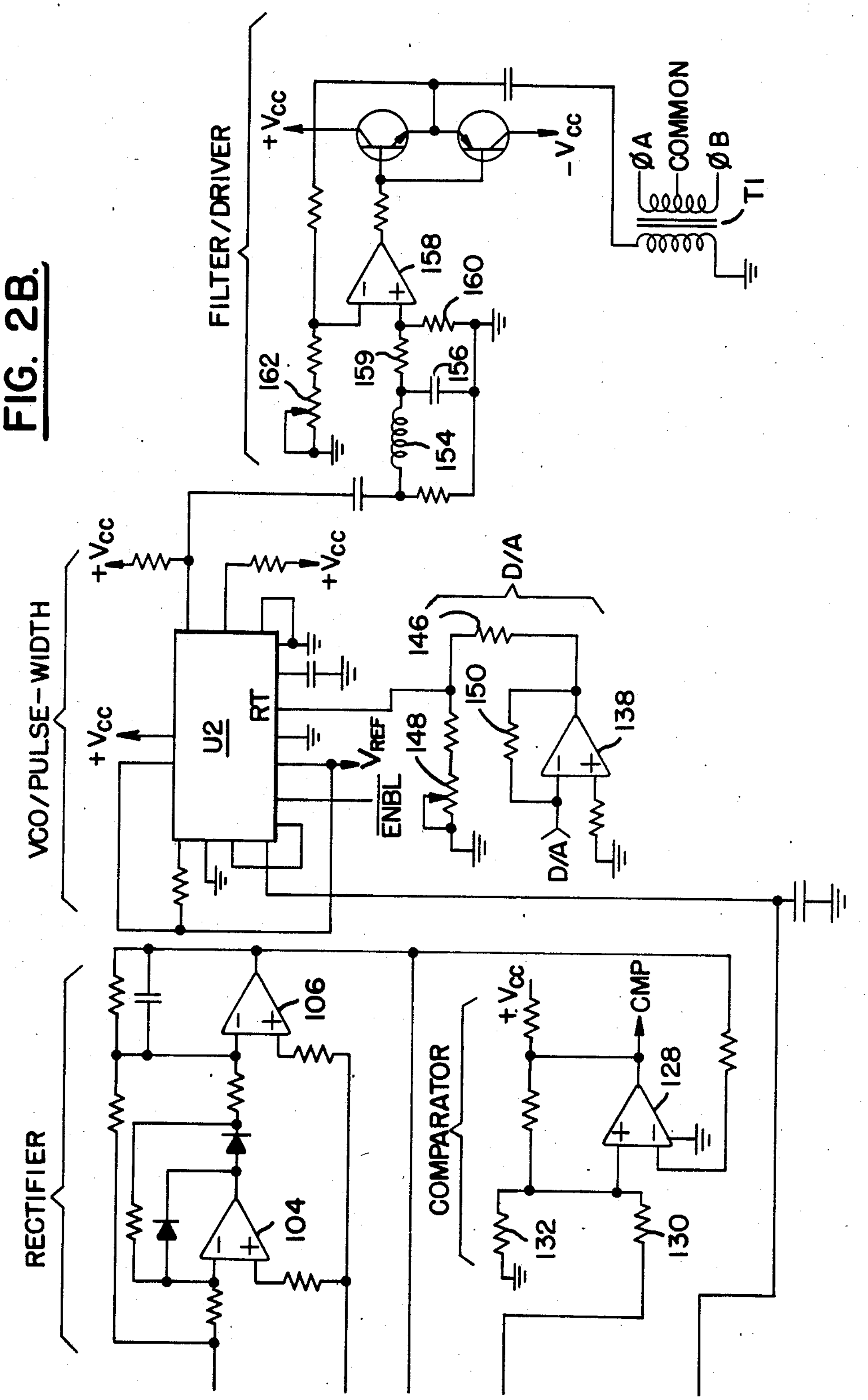
Figure 2C:
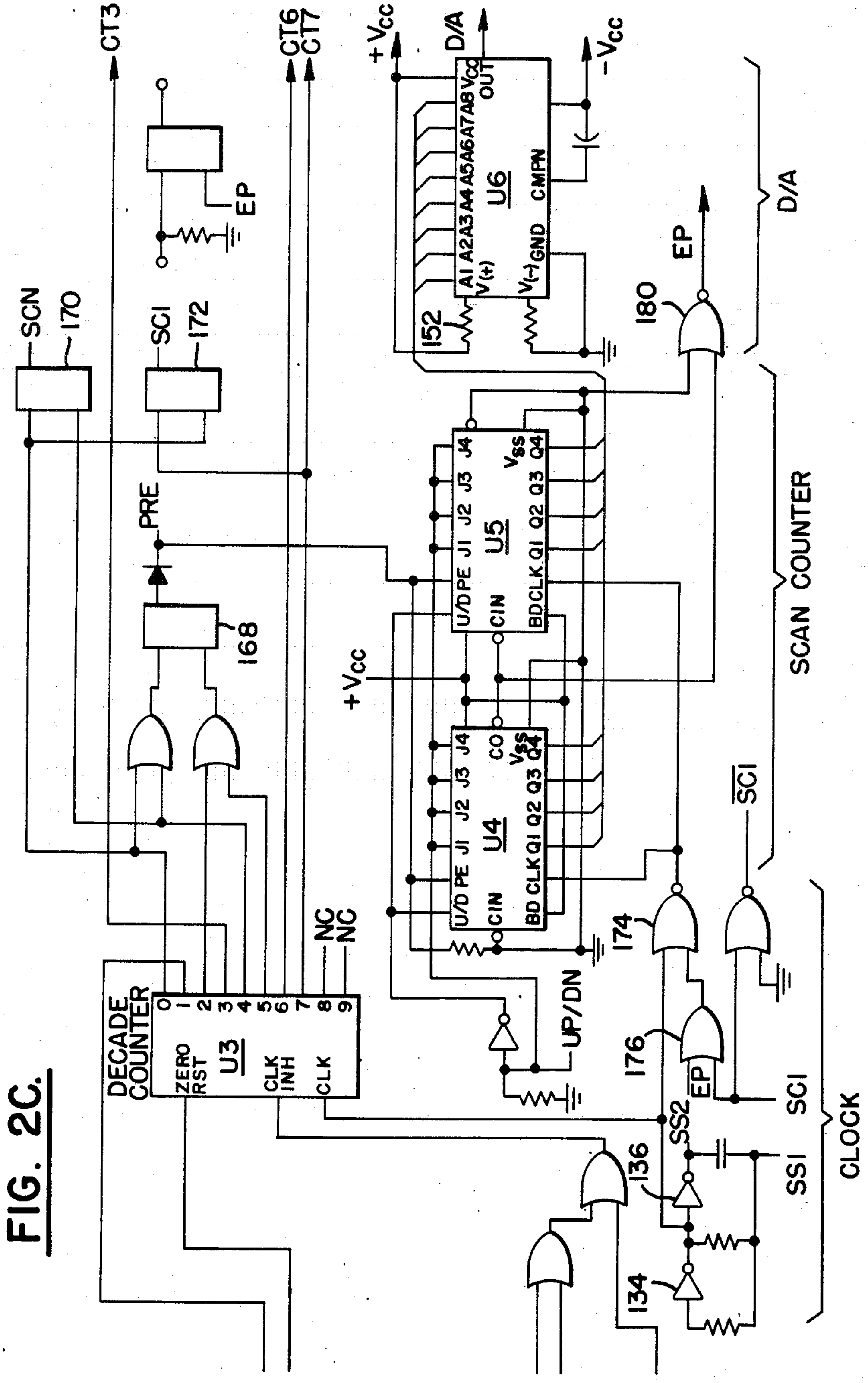
Figure 3:
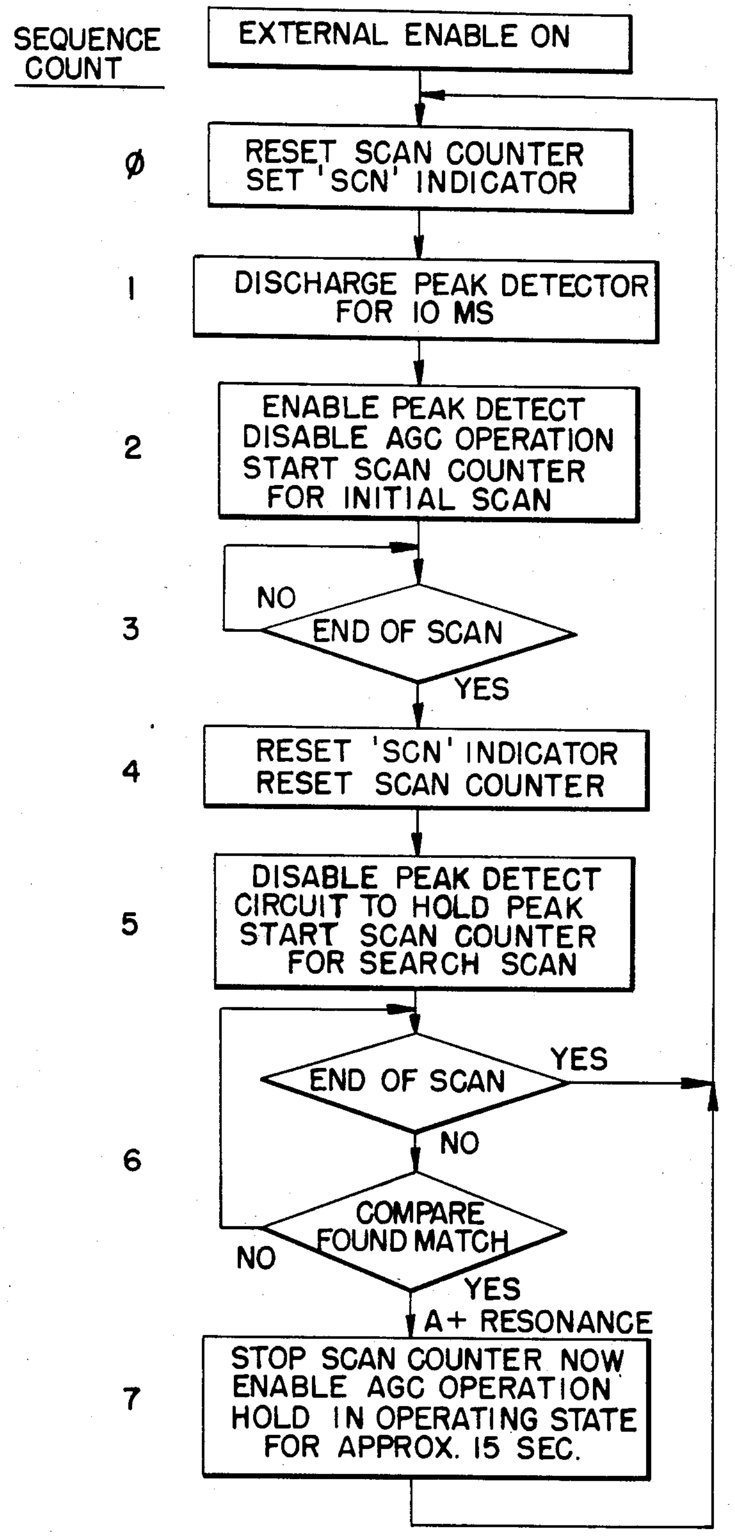
FIG. 3 is a flow chart for explaining the operation of the system of FIGS. 1 & 2A–2C.

FIGS. 2A, 2B and 2C together comprise a detailed schematic diagram of certain components which when connected as shown will carry out the operation described in connection with the block circuits of FIG. 1. FIG. 3 shows the sequence of operations which occur in the circuit of FIGS. 2A–2C.

The preamplifier 20 of FIG. 1 appears in FIG. 2A as two operational amplifiers 100, 102. The gain of each amplifier is determined by its associated feedback and input resistors, and filtering is effected by feedback and input capacitors as shown. Typically, the overall gain can be about 100 at an operating frequency of 30 KHZ. The filtering provides rejection of the third harmonic (90 KHZ) which could cause locking on an erroneous frequency.

Rectifier 22 of FIG. 1 appears in FIG. 2B also in the form of two operational amplifiers 104, 106. The output of amplifier 102 is coupled to the rectifier input which converts the output signal to a filtered negative DC level corresponding to the average of the amplified feedback signal (typically between −6 volts and −7 volts). The negative DC voltage level is used by the peak detector, AGC, and comparator portions of the circuitry in FIG. 2.

Operational amplifiers 108 and 110 form a peak detector in FIG. 2A (block 26 in FIG. 1) using diode 112 and capacitor 114 for storage. As peak voltages from the output of rectifier amplifier 106 reach the peak detector amplifier 108, they are stored in capacitor 114 but cannot discharge because of diode 112. The result is that the highest peak is obtained on capacitor 114. Amplifier 110 serves as a buffer to prevent the following circuitry from discharging capacitor 114 prior to initiating each first scan cycle. Capacitor 114 is discharged through resistor 116 by an FET switch contained within an FET switch switch chip U1, to reset the peak detector.

An AGC circuit (block 38 in FIG. 1) is comprised of amplifier 118 arranged as an integrator. The gain of the circuit may range from 0.5 at frequencies above 160 Hz to infinity at DC resulting in very low response to high frequency noise, while retaining high gain at lower frequencies where it is required to respond to changes and conditions at the horn environment. The AGC circuit compares the output of the rectifier circuit with a level preset by a potentiometer 120 and produces an output voltage corresponding to the difference between the rectifier output level and the preset level. When switched in circuit by an FET switch in the chip U1, the AGC output is connected to a VCO chip U2 (FIG. 2B) to control the pulse duty cycle of the output signal from the chip U2. To prevent a negative swing which could damage the oscillator chip U2, a diode 122 clamps the output to a minimum of 0.6 volts.

A scan comparator corresponding to the comparator 24 in FIG. 1, is shown in FIG. 2B as amplifier 128. One input of amplifier 128 is coupled to the output of rectifier amplifier 106, and the other amplifier input receives a signal of about 90% of the output buffer amplifier 110 (FIG. 2A) through resistors 130, 132. When the rectifier signal exceeds 90% of the level on the peak detector, the output of the comparator 128 goes to a logic 1 corresponding to a match signal having the designation CMP. Scanning logic corresponding to the blocks 28, 30, 32, and 34 in FIG. 1, is shown in FIG. 2C as a system clock comprised of inverting amplifiers 134, 136 connected in a resistor-capacitor network to provide a clock frequency of about 790 Hz; a decade sequence counter chip U3 which produces pulses used to perform various time related functions within a scanning cycle in response to the system clock; a scan counter comprised of two binary counter chips U4, U5 which are clocked by the system clock up to a binary count of 255; and a D/A converter comprised of chip U6 and amplifier 138. The D/A chip U6 receives the binary output from the counter chips U4, U5 and produces an output current proportional to the input count. Amplifier 138 functions as a current to voltage converter and produces a linear voltage ramping from 0 to 9 volts which controls the frequency of the VCO chip U2.

A system enable (ENBL) signal is produced when equipment such as a clinical analyzer (not shown) with which the horn is used, indicates that the first scan cycle for determining an initial resonant frequency for the horn is to be initiated. The ENBL signal which may be at a 5 volt level, is applied to resistor 140 and capicitor 142 (FIG. 2A) to cause a delay of about 220 msec. allowing time for a one shot 144 and the decade counter chip U3 to reset. The inverse of the ENBL signal is used to enable the VCO chip output through connection to the DTC input of chip U2.

The VCO chip U2 (e.g. device type TL494) functions as a voltage and pulse duty cycle controlled oscillator. The voltage from the D/A amplifier 138 is connected by resistor 146 to the frequency control (RT) input of chip U2. This is a current node, so resistor 146 converts the D/A output to an 18 ua current variation at the node which causes a change in the oscillator frequency of about 2500 Hz. The range of the sweep is adjusted by resistor 148 from about 25.5 KHz to about 35.5 KHz. Since the nominal resonance of the horn is 30 KHz, this allows compensation for all tolerances within the system. The sweep width is established by resistors 150, 152 and 146. Resistors 150, 152 regulate the voltage output of amplifier 138 while resistor 146 varies the current at the node (RT). AGC output is coupled from the corresponding FET switch in chip U1 to an associated (+) input of VCO chip U2 to control the pulse duty cycle of the VCO output.

Since the output from VCO chip U2 is in pulse form, the output must be filtered to resemble a sine wave as much as possible for driving the horn converter 12 (FIG. 1). Such function is performed by a filter/driver stage comprised of LC network 154, 156, buffer amplifier 158 and totem pole amplifier Q1, Q2 which drives output transformer T1. Filter network 154, 156 is resonant at about 28 KHz to produce a good sine wave at any pulse frequency above 28 KHz. The amplitude of the filter network output decreases with narrower pulse width, and it is this effect which accomplishes the AGC function of the present invention. The filter network output is attenuated by resistors 159, 160 and supplied to an input terminal of the amplifier 158. Gain adjustment is provided by a variable resistor 162. The correct overall setting is one at which the signal at the transformer T1 shows no clipping at the low frequency limit of each scan cycle or sweep. The output of T1 serves as a gate drive signal for a conventional push-pull power amplifier details of which are omitted from FIG. 2B.

In operation, during an initial scan the AGC is disabled by the corresponding switch in FET chip U1 and replaced by a fixed voltage level (e.g. 2.74 volts) from a resistor network 164, 166. This maintains a constant drive level from the VCO chip U2. When the first scan is completed, the level of the resonant peak is stored in the peak detect/hold circuitry and is present at one input of the comparator 128.

During the second scan, which is also at a fixed drive level, the remaining input of the comparator 128 receives the rectifier output. Since the output voltage from the peak detect/hold circuit is reduced by 10%, when the rectifier output reaches 90% of the resonant peak level of the previous scan, the output of comparator 128 switches to a logic 1 which is the CMP signal, and scanning is stopped at this time. During the period when the VCO is locked at a resonant frequency, AGC is enabled continuously to compare the feedback signal with the preset voltage, and control the VCO output pulse width accordingly. Therefore, the power obtained with the system of FIG. 2 is held under extremely tight control by the AGC action.

Operation of the control logic/timing circuitry of FIGS. 2A–2C is represented in the flow diagram of FIG. 3. At sequence count 0, a PRE flip-flop 168 is set by the decade sequence counter chip U3. Signal PRE sets the binary scan counter chips U4, U5 to zero. Also, an SCN flip-flop 170 is set to indicate the start of a scan, and an SCI flip-flop 172 is reset to enable the scan counter chips U4, U5 to perform a scan by allowing the system clock signals to pass to the counter chips through a NOR gate 174 having one input connected to the system clock and the other connected to an OR gate 176 which receives the Q output of flip-flop 172. The SCI flip-flop also operates 3 FET switches in the chip U1.

Sequence count 1 from the chip U3 sets the one-shot 144 in a high state for 10 msec., inhibiting response to the system clock to allow time for the peak detector to discharge. After 10 msec., the one-shot 144 goes low enabling the system clock to allow the count to continue.

Sequence count 2 serves to reset the PRE (preset) flip-flop 168, allowing the scan counter chips U4, U5 to function.

Sequence count 3 and associated logic of AND gate 178 and NOR gate 180 stop further advance of counter U3, while allowing scan counters U5, U6 to continue counting. Signal EP becomes high at the end of the scan count, allowing counter U3 to continue to count 4.

The count 4 output of sequence counter chip U3 resets flip-flop 170 to indicate the end of a scan (SCN goes low). Also flip-flop 168 resets the scan counter chips U4, U5, (PRE goes high) prior to the beginning of the second scan.

At count 5, flip-flop 168 is reset to permit the start of the second scan and a search for the peak amplitude in the horn feedback signal.

Sequence count 6, through AND gate, 182 enables detection of either a CMP signal indicating a matched signal from the comparator, or the EP signal from NOR gate 180 indicating that no match occurred prior to the end of a scan. Either condition allows sequence counter chip U3 to reach count 7.

At count 7, the SCI flip-flop 172 is set and the scan counter chips U4, U5 are stopped. If EP is high indicating the end of the second scan without producing a match signal, then the sequence counter chip U3 is reset to zero to initiate a new scan. If, however, signal EP is low, this indicates that a compare has been found. AND gate 186 triggers one-shot 188 which provides, e.g., a fifteen second pulse, thus holding the sequence count at 7. After fifteen seconds, the clock is re-enabled to allow the counter chip U3 to run back to count zero and begin a new scan sequence.

Imminent failure of the horn will be indicated by the inability to obtain a match signal (CMP), reflecting an abnormal deviation of the operating resonant frequency from the nominal frequency.

While the foregoing description represents a preferred embodiment of the present invention, it will be obvious to those skilled in the art that various changes and modifications may be made, without the departing from the true spirit and scope of the present invention.

I claim:

1. Apparatus for driving an ultrasonic horn at a resonant frequency actively determined during operation of the horn under varying load conditions, comprising:

frequency scanning and drive means for driving an ultrasonic horn with a drive signal of determined amplitude and frequency;

feedback means in the vicinity of the horn for sensing ultrasonic vibration waves from the horn in an operating environment when driven by said frequency scanning and drive means, and for producing an output signal corresponding to the frequency and amplitude of said ultrasonic waves;

rectifier means for detecting the output signal of said feedback means and for developing a direct current amplitude signal representative of the amplitude of said output signal;

peak detector means coupled to said rectifier means for developing a peak signal corresponding to the maximum level of said amplitude signal attained during a first scan of said frequency scanning and drive means, wherein said drive signal is at a fixed amplitude but is varied in frequency between limits about a nominal frequency;

comparator means coupled to said rectifier means and said peak detector means for comparing said amplitude signal and said peak signal with one another over a second scan of said frequency scanning and drive means between said frequency limits with said fixed amplitude drive signal, and for producing a match signal indicative of a resonant condition for said horn when said amplitude and said peak signals are substantially equal; and control means coupled to said comparator means and said frequency scanning and drive means for controlling said first and said second scan operations and interrupting said second scan in response to said match signal, and for enabling said scanning and drive means to continue to operate the horn at a frequency corresponding to said resonant condition for a given time period.

2. Apparatus according to claim 1, including gain control means coupled between said rectifier means and said frequency scanning and drive means, for varying the amplitude of said drive signal during said given time period in accordance with a difference between said amplitude signal and a preset level, to minimize said difference.

3. Apparatus according to claim 1, wherein said control means includes means for initiating said first and second scan operations of said frequency scanning and drive means at the end of said given time period, so that an updated resonant frequency corresponding to a resonant condition for said horn is tracked and said horn is driven at said updated resonant frequency over successive given time periods of operation of said horn.

4. A method of actively tracking the operating resonant frequency of an ultrasonic horn having a nominal resonant frequency and arranged in a liquid bath in a clinical analyzer, the horn serving to dissolve solid tablets in liquid solutions contained in a series of cuvettes moving along a path in the vicinity of the horn, comprising:

driving said horn with a drive signal of fixed amplitude while varying over a first scan the frequency of the drive signal between limits about the nominal resonant frequency;

sensing ultrasonic vibration waves from the horn when driven by the drive signal over the first scan;

producing a feedback signal corresponding in frequency and amplitude to the ultrasonic waves;

developing a direct current amplitude signal representing the amplitude of the feedback signal over said first scan;

detecting and holding the peak of said amplitude signal thereby forming a peak signal corresponding to the maximum level of said amplitude signal attained during the first scan;

driving said horn with said fixed amplitude drive signal while varying the frequency of the drive signal over a second scan between said limits;

comparing said amplitude signal and said peak signal with one another during said second scan and producing a match signal representing a resonant condition for said horn when said amplitude and said peak signals are substantially equal; and continuing to drive said horn at a frequency corresponding to said resonant condition for a given time period.

5. The method of claim 4, including determining a difference between said amplitude signal and a preset level, and varying the average power of the drive signal during said given time period to minimize said difference.

6. The method of claim 4, including initiating the first and the second scan operations at the end of said given time period thereby tracking an updated resonant frequency corresponding to a resonant condition for the horn, and driving the horn at the updated resonant frequency over successive time periods of operation of said horn.

7. A system for actively tracking the operating resonant frequency of an ultrasonic horn having a nominal resonant frequency and at least partly immersed in a liquid bath in a clinical analyzer, wherein the horn serves to dissolve solid tablets in liquid solutions contained in a series of cuvettes which pass on belt means along a path in the vicinity of said horn, comprising:

an ultrasonic horn for producing ultrasonic vibration waves which interact with the liquid solutions in the cuvettes to dissolve said tablets;

amplifier means for supplying a drive signal at a given frequency and amplitude to said horn, wherein the ultrasonic waves have a frequency and amplitude corresponding to those of said drive signal;

frequency scanning means coupled to said amplifier means for determining the frequency of said drive signal;

feedback means in the region of said horn for sensing ultrasonic waves from the horn while said cuvettes pass in the vicinity of said horn on the belt means, and for producing an output signal corresponding to the frequency and amplitude of said ultrasonic waves;

rectifier means for detecting the output signal of said feedback means and for developing a direct current amplitude signal representative of the amplitude of said output signal;

peak detector means coupled to said rectifier means for developing a peak signal corresponding to the maximum level of said amplitude signal attained during a first scan of said frequency scanning means, wherein said drive signal is at a fixed amplitude but is varried in frequency between limits about the nominal resonant frequency of the horn;

comparator means coupled to said rectifier means and said peak detector means for comparing said amplitude signal and said peak signal with one another over a second scan of said frequency scanning means between said frequency limits with said fixed amplitude drive signal, and for producing a match signal indicative of a resonant condition for said horn when said amplitude and said peak signals are substantially equal; and control means coupled to said comparator means and said frequency scanning means for controlling said first and said second scan operations and interrupting said second scan in response to said match signal, and for enabling said scanning means to continue to operate the horn at a frequency corresponding to said resonant condition for a given time period.

8. A system according to claim 7, including gain control means coupled between said rectifier means and said amplifier means, for varying the average power of said drive signal during said given time period in accordance with a difference between said amplitude signal and a preset level, to minimize said difference.

9. A system according to claim 7, wherein said control means includes means for initiating said first and said second scan operations of said frequency scanning means at the end of said given time period, so that an updated resonant frequency corresponding to a resonant condition for said horn is tracked and said horn is driven at said updated resonant frequency over successive given time periods of operation of said horn.

* * * * *